(12) United States Patent
Im et al.

(10) Patent No.: US 8,980,679 B2
(45) Date of Patent: Mar. 17, 2015

(54) APPARATUS AND METHODS FOR FORMING PHASE CHANGE LAYER AND METHOD OF MANUFACTURING PHASE CHANGE MEMORY DEVICE

(75) Inventors: Dong-Hyun Im, Gyeonggi-do (KR); Byoungjae Bae, Gyeonggi-do (KR); Dohyung Kim, Gyeonggi-do (KR); Sunglae Cho, Gyeonggi-do (KR); Jinil Lee, Gyeonggi-do (KR); Juhyung Seo, Gyeonggi-do (KR); Hyeyoung Park, Gyeonggi-do (KR); Takehiko Fujita, Yamanashi Prefecture (JP)

(73) Assignee: Samsung Electronics Co., Ltd. (KR)

(*) Notice: Subject to any disclaimer, the term of this patent is extended or adjusted under 35 U.S.C. 154(b) by 1453 days.

(21) Appl. No.: 12/550,897

(22) Filed: Aug. 31, 2009

(65) Prior Publication Data
US 2010/0055829 A1   Mar. 4, 2010

(30) Foreign Application Priority Data
Sep. 3, 2008  (KR) ................. 10-2008-0086959

(51) Int. Cl.
*H01L 21/00* (2006.01)
*H01L 45/00* (2006.01)
*C23C 16/455* (2006.01)

(52) U.S. Cl.
CPC ........ *H01L 45/124* (2013.01); *C23C 16/45531* (2013.01); *C23C 16/45546* (2013.01); *H01L 45/06* (2013.01); *H01L 45/126* (2013.01); *H01L 45/143* (2013.01); *H01L 45/144* (2013.01); *H01L 45/148* (2013.01); *H01L 45/1616* (2013.01); *H01L 45/1691* (2013.01)

USPC ............... 438/84; 438/95; 438/102; 438/103; 257/42; 257/E31.008; 257/E21.068

(58) Field of Classification Search
None
See application file for complete search history.

(56) References Cited

U.S. PATENT DOCUMENTS

| | | | |
|---|---|---|---|
| 7,208,428 B2* | 4/2007 | Hishiya et al. ................ 438/795 |
| 7,491,573 B1* | 2/2009 | Schrott et al. ................... 438/95 |
| 7,576,016 B2* | 8/2009 | Koyanagi et al. ............ 438/785 |
| 7,727,884 B2* | 6/2010 | Bae et al. ...................... 438/631 |
| 7,972,649 B2* | 7/2011 | Hirata ............................... 427/8 |
| 8,235,001 B2* | 8/2012 | Sano et al. .................... 118/696 |
| 2006/0027451 A1 | 2/2006 | Park et al. |
| 2006/0032442 A1 | 2/2006 | Hasebe |
| 2007/0048977 A1 | 3/2007 | Lee et al. |
| 2007/0054475 A1 | 3/2007 | Lee et al. |
| 2007/0160760 A1 | 7/2007 | Shin et al. |
| 2008/0050884 A1 | 2/2008 | Koyanagi et al. |
| 2008/0054244 A1* | 3/2008 | Lee et al. ........................ 257/3 |
| 2009/0124039 A1 | 5/2009 | Roeder et al. |
| 2013/0005078 A1 | 1/2013 | Roeder et al. |

FOREIGN PATENT DOCUMENTS

| | | |
|---|---|---|
| JP | 2006-054432 A | 2/2006 |
| JP | 2007-056369 | 3/2007 |
| JP | 2007-186784 | 7/2007 |

(Continued)

*Primary Examiner* — Bac Au
*Assistant Examiner* — Khanh Duong
(74) *Attorney, Agent, or Firm* — Myers Bigel Sibley & Sajovec, P.A.

(57) ABSTRACT

Provided are apparatus and methods for forming phase change layers, and methods of manufacturing a phase change memory device. A source material is supplied to a reaction chamber, and purges from the chamber. A pressure of the chamber is varied according to the supply of the source material and the purge of the source material.

9 Claims, 10 Drawing Sheets (56) References Cited

FOREIGN PATENT DOCUMENTS

| | | |
|---|---|---|
| JP | 2008-053326 A | 3/2008 |
| JP | 2009-536986 A | 10/2009 |
| KR | 1020060076262 A | 7/2006 |
| KR | 10-2007-0023432 A | 2/2007 |
| KR | 1020070023433 A | 2/2007 |
| KR | 100695168 B1 | 3/2007 |
| KR | 1020090029488 | 3/2009 |
| WO | WO 2007/133837 A2 | 11/2007 |

\* cited by examiner

APPARATUS AND METHODS FOR FORMING PHASE CHANGE LAYER AND METHOD OF MANUFACTURING PHASE CHANGE MEMORY DEVICE

CROSS-REFERENCE TO RELATED APPLICATIONS

This U.S. non-provisional patent application claims priority under 35 U.S.C. §119 of Korean Patent Application No. 10-2008-0086959, filed on Sep. 3, 2008, the content of which is herein incorporated by reference in its entirety.

BACKGROUND

The present invention relates to semiconductor fabrication techniques and, more particularly, to methods of fabricating phase change materials and devices including the same.

Semiconductor memory devices may be classified into volatile memory devices, such as dynamic random access memory (DRAM) and static random access memory (SRAM), which typically cannot maintain data when a power supply is interrupted, and nonvolatile memory devices, such as flash memory and electrically erasable programmable read only memory (EEPROM), which can maintain data even when a power supply is interrupted. Flash memory is commonly used in electronic devices, such as memory cards or MP3 players, because of its nonvolatile characteristic.

Recently, next generation memory devices have been developed as potentially replacements for conventional flash memory. These next generation devices include magnetoresistive random access memory (MRAM), ferroelectric random access memory (FRAM) and phase-change random access memory (FRAM). In a typical phase-change memory device, a chalcogen compound, such as germanium(Ge)-antimony(Sb)-tellurium(Te) (GST), is used as a phase-change material. Data is stored as a logic "0" or a logic "1" using a difference of a resistance caused by a reversible phase transition of the phase-change material. In particular, a composition ratio of a phase-change material or a composition distribution according to a thickness of a phase-change material may affect the resistivity of a phase-change layer, thereby determining an electrical characteristic of a phase-change memory device.

SUMMARY

Some embodiments provide methods of forming a phase change layer. The methods may include supplying a source material to a chamber and purging the source material from the chamber. A pressure of the chamber is changed according to the supply of the source material and the purge of the source material.

Some embodiments provide methods of forming a phase change layer. The methods may include supplying a reaction gas to a chamber; setting the chamber at a high pressure to supply Ge, Te and Sb source materials, performing a reaction of the source materials to the reaction gas to deposit Ge—Sb—Te and setting the chamber at a low pressure to purge the source materials.

Some embodiments provide apparatus for forming phase change layers. The apparatus may include a chamber loading a substrate, a heater controlling a temperature of the chamber, a source material supply portion supplying at least one source material to the chamber, a reaction supply portion supplying a reaction gas to the chamber and an exhaust portion discharging a gas from the chamber.

Some embodiments provide methods of manufacturing a phase change memory device. The methods may include forming an upper electrode and a lower electrode facing to each other and forming a phase change layer between the upper and lower electrodes. Forming the phase change layer includes repeatedly supplying a precursor including a plurality of organo-metallic compounds to a chamber and purging the plurality of organo-metallic compounds from the chamber and setting a pressure of the chamber when supplying the plurality of organo-metallic compounds to the chamber to be higher than a pressure of the chamber when purging the plurality of organo-metallic compounds from the chamber.

In further embodiments of the present invention, methods of fabricating a phase change material layer on a semiconductor wafer are provided. A first reaction gas is supplied to a reaction chamber containing the semiconductor wafer to achieve a first pressure in the reaction chamber. A gas containing a first metalloid is supplied to the chamber at a pressure greater than the first pressure to thereby deposit the first metalloid on the wafer. A purge gas is supplied to the reaction chamber while exhausting the reaction chamber to reduce pressure therein. A second reaction gas is provided to the reaction chamber containing the semiconductor wafer to achieve a second pressure in the reaction chamber. A gas containing a second metalloid is supplied to the reaction chamber at a pressure greater than the second pressure to thereby deposit the second metalloid on the wafer. At least one of the first metalloid and the second metalloid includes a chalcogen. For example, the first metalloid may include germanium (Ge) and the second metalloid may include tellurium (Te). In some embodiments, the second pressure is less than the second pressure. The first and second reaction gases may each include ammonia ($NH_3$).

In further embodiments, supplying a gas containing a first metalloid to the chamber at a pressure greater than the first pressure to thereby deposit the first metalloid on the wafer is preceded by evaporating a first liquefied organometallic compound including the first metalloid and mixing the evaporated first organometallic compound with a carrier gas to generate the gas containing the first metalloid, and supplying a gas containing a second metalloid to the reaction chamber at a pressure greater than the second pressure to thereby deposit the second metalloid on the wafer is preceded by evaporating a second liquefied organometallic compound including the second metalloid and mixing the evaporated second organometallic compound with a carrier gas to generate the gas containing the second metalloid. Supplying a gas containing a second metalloid to the reaction chamber at a pressure greater than the second pressure to thereby form a second layer on the wafer may be followed by supplying a purge gas to the reaction chamber while exhausting the reaction chamber to reduce pressure therein, supplying a third reaction gas to the reaction chamber containing the semiconductor wafer to achieve a third pressure in the reaction chamber and supplying a gas containing a third metalloid to the reaction chamber at a pressure greater than the third pressure to thereby deposit the third metalloid on the wafer. The first metalloid may include Ge, the second metalloid may include Te and the third metalloid may include antinomy (Sb). The second pressure and the third pressure may each be less than the first pressure.

In additional embodiments, supplying a gas containing a third metalloid to the reaction chamber at a pressure greater than the third pressure to thereby deposit the third metalloid on the wafer is followed by supplying a purge gas to the reaction chamber while exhausting the reaction chamber to reduce pressure therein, supplying a fourth reaction gas to the reaction chamber containing the semiconductor wafer to achieve a fourth pressure in the reaction chamber and supplying a gas containing the second metalloid to the reaction chamber at a pressure greater than the fourth pressure to thereby deposit the second metalloid on the wafer.

In some embodiments, supplying a gas containing a first metalloid to the chamber at a pressure greater than the first pressure to thereby deposit the first metalloid on the wafer includes supplying a gas containing Ge and Te to the chamber at a pressure greater than the first pressure to thereby deposit Ge and Te on the wafer. Supplying a gas containing a second metalloid to the reaction chamber at a pressure greater than the second pressure to thereby deposit the second metalloid on the wafer may include supplying a gas containing Sb and Te to the chamber at a pressure greater than the first pressure to thereby deposit Sb and Te on the wafer.

Methods may further include supplying a dopant gas including silicon (Si), nitrogen (N), oxygen (O), bismuth (Bi), tin (Sn) and/or boron (B) concurrent with supplying the gases containing the first and second metalloids and maintaining temperature in the reaction chamber at a temperature greater than about 275° C.

BRIEF DESCRIPTION OF THE DRAWINGS

The accompanying figures are included to provide a further understanding of the present invention, and are incorporated in and constitute a part of this specification. The drawings illustrate embodiments of the present invention and, together with the description, serve to explain principles of the present invention.

DETAILED DESCRIPTION

The present invention now will be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when an item (e.g., a component, region, layer, section, unit, module, device, circuit, etc.) is referred to as being on, connected to and/or coupled to another item, the item may be directly on, connected and/or coupled to the other item, or intervening items may be present. In contrast, when an item is referred to as being directly on, directly connected to and/or directly coupled to another item, no intervening items are present. As used herein, the term "and/or" includes any and all combinations of one or more of the associated listed items.

It will also be understood that, although the terms first, second, etc., may be used herein to describe various items, these items should not be limited by these terms. Rather, these terms are used merely as a convenience to distinguish one item from another item. For example, a "first" item could be termed a "second" item without departing from the teachings of the present invention.

Spatially relative terms, such as beneath, below, lower, above, upper, "top," "bottom" and the like, may be used to describe an item's relationship to another item as, for example, illustrated in the figures. It will be understood that the spatially relative terms are intended to encompass different orientations of the device in use and/or operation in addition to the orientation depicted in the figures. For example, when the device in the figures is turned over, items described as below and/or beneath other items would then be oriented above the other items. The device may be otherwise oriented (rotated 90 degrees or at other orientations) and the spatially relative descriptors used herein interpreted accordingly. As used herein, "height" refers to a direction that is generally orthogonal to the faces of a substrate.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprise," "comprising," includes, including, "have", "having" and variants thereof specify the presence of stated items, features, integers, steps, operations and the like, but do not preclude the presence and/or addition of one or more other items, features, integers, steps, operations and the like, or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Figure 1:
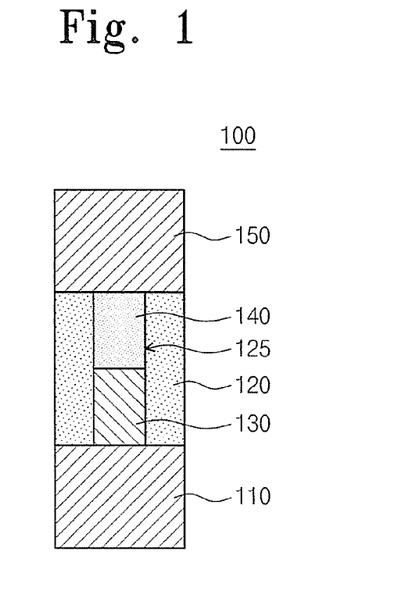
FIG. 1 is a cross sectional view of a phase-change memory device including a phase-change layer according to some embodiments of the present invention.
Figure 2:
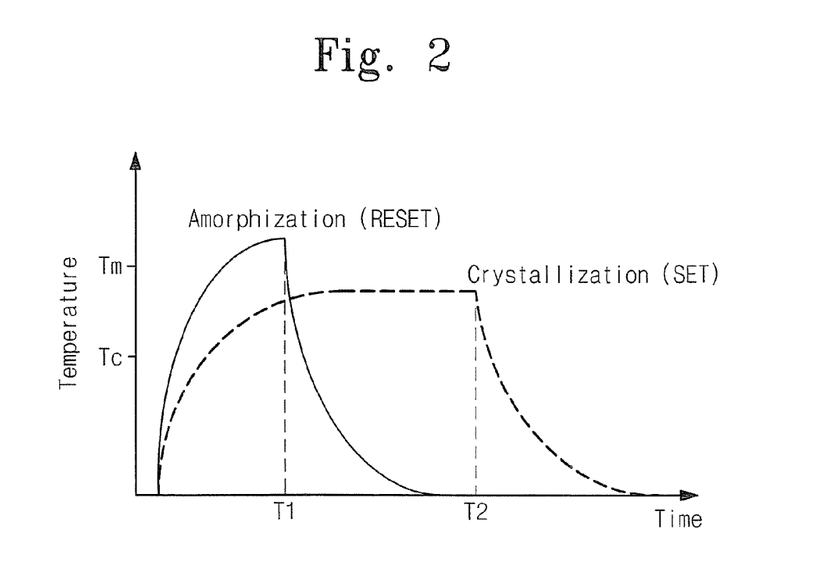
FIG. 2 is a graph illustrating operations for programming and erasing a phase change memory device.

FIG. 1 is a cross sectional view of a phase-change memory device including a phase-change layer according to some embodiments of the present invention. FIG. 2 is a graph illustrating operations for programming and erasing a phase change memory device. In FIG. 2, the horizontal axis represents a time and the vertical axis represents a temperature of a phase transition layer.

Referring to FIG. 1, a phase-change memory device 100 may include a phase change layer 140 comprising a phase change material which performs a reversible phase transition, a heater 130 configured to apply heat to cause the phase change layer 140 to performs a phase transition from a crystalline state to an amorphous state or vice versa, a lower electrode 110 connected to the heater 130, an upper electrode 150 connected to the phase change layer 140, and an insulating layer 120 surrounding the phase change layer 140 and the heater 130.

Referring to FIG. 2 in conjunction with FIG. 1, as shown with a solid line, if the phase change layer 140 is cooled after heating the phase change layer 140 for a time period T1 at a temperature higher than a melting temperature (Tm), the phase change layer 140 transitions to an amorphous state. As shown with a dotted line, if the phase change layer 140 is cooled after heating the phase change layer 140 for a time period T2 greater than the time period T1 at a temperature lower than the melting temperature (Tm) but higher than a crystallization temperature (Tc), the phase change layer 140 transitions to a crystalline state. Transition of the phase change layer 140 from a crystalline state to an amorphous state may be termed a "reset" operation, and transition of the phase change layer 140 from an amorphous state to a crystalline state may be termed a "set" operation. Resistivity of the phase change layer 140 in an amorphous state typically is higher than resistivity of the phase change layer 140 in a crystalline state. Thus, it can be discriminated whether data stored in a phase change memory cell is logic "1" or logic "0" by detecting a current flowing through the phase change layer 140 in a read operation.

It is known that current required to reset a phase change memory cell may be very large. A large current may be an obstacle to creating a transistor of a small size, which means that it may be difficult to manufacture a phase change memory device with a high degree of integration. Thus, phase change memory device such as the memory device 100 having the confined structure depicted in FIG. 1 has been introduced to potentially reduce reset current.

Referring to FIG. 1 again, the phase-change memory device 100 can be embodied by forming the heater 130 in a portion of a hole 125 formed by removing a portion of an insulating layer 120. The heater 130 is connected to a lower electrode 110, the phase-change layer 140 which fills the rest portion of the hole 125 and is connected to the heater 130, and the upper electrode 150 which is connected to the phase change layer 140 and disposed on the insulating layer 120. The lower electrode 110 and the upper electrode 140 may, for example, include a metal (e.g., tungsten (W), titanium (Ti) and tantalum (Ta), a metal silicide (e.g., tungsten silicide), or polysilicon. The heater 130 may, for example, be formed of an alloy of titanium series, such as TiN, TiW, TiAlN, or a metal, such as tungsten (W). Techniques for manufacturing the phase change memory device 100 are described in U.S. Patent Application Publication No. 2008/0020564, which is incorporated herein by reference in its entirety.

The phase change layer 140 may be formed to such that it is surrounded with the insulating layer 120 by depositing a chalcogen compound in the hole 125 so that the phase change layer 140 has a limited area of contact with the lower electrode 110 and the upper electrode 150. Because heat generated from the phase change layer 140 transfers to the upper electrode 150 and/or the lower electrode 150 through a limited area, heat loss can be reduced or minimized. As the phase change layer 140 is isolated from heat by the limitation of the area in contact with the electrodes 110 and 150, and/or a small depth of the hole 125, a reset current can be reduced.

Figure 3A:
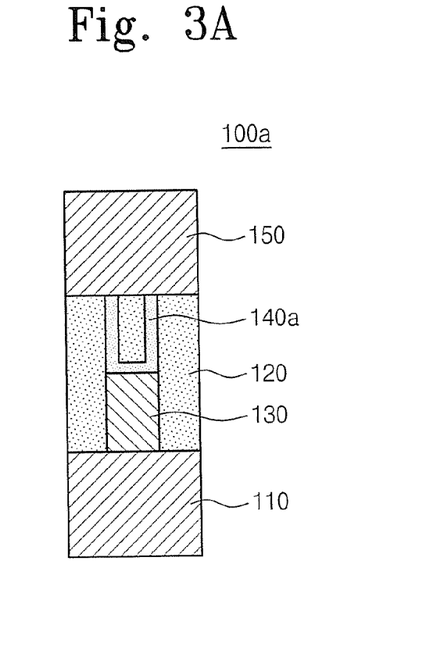
FIGS. 3A through 3D are cross sectional views of a phase-change memory device including a phase-change layer according to further embodiments of the present invention.
Figure 3B:
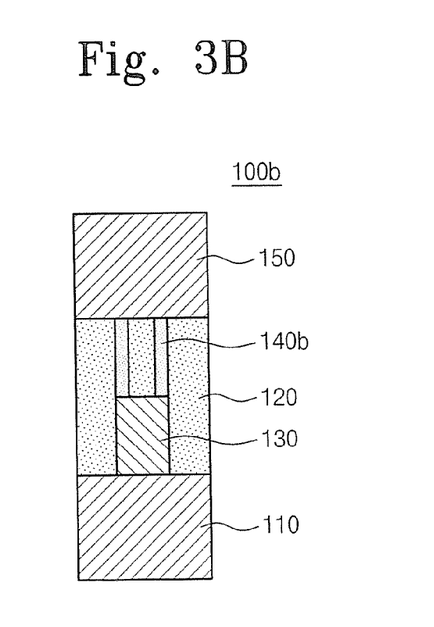
Figure 3C:
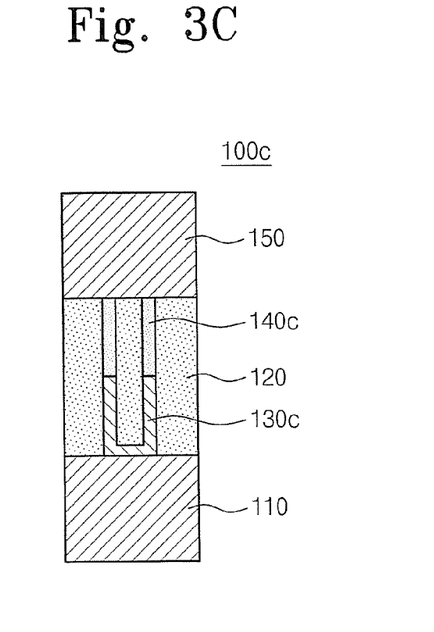
Figure 3D:
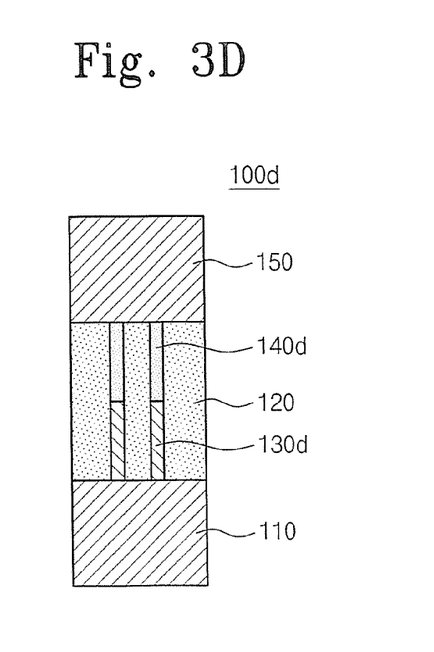

FIGS. 3A through 3D are cross sectional views of modified examples of a phase-change memory device including a phase-change layer according to further embodiments of the present invention. As shown in FIG. 3A, a phase change layer 140a of a phase change memory device 100a may be formed so that an area of the phase change layer 140a in contact with an upper electrode 150 is reduced. In FIG. 3B, a phase change memory device 100b may be formed to include a phase change layer 140b having limited areas of contact with an upper electrode 150 and a heater 130. In FIG. 3C, a phase change memory device 100c may be formed to include a phase change layer 140c having limited contact area with an upper electrode 150 and a heater 130c having a smaller volume than the heater 130 of FIG. 1. In FIG. 3D, a phase change memory device 100d may be formed to include a phase change layer 140d having a limited contact area with an upper electrode 150 and a heater 130d having a limited contact area with a lower electrode 110.

Referring to FIG. 1 again, it may be difficult to deposit chalcogen compound in the hole 125 using a sputtering method to uniformly form the phase change layer 140. Such difficulties may be increased when an aspect ration of the hole 125 is great. It may be difficult to form the phase change layers 140a, 140b, 14c, 140d having relatively small structures as depicted in FIGS. 3A, 3B, 3C and 3D with desired compositions and uniform thickness distributions. A phase change layer may formed by depositing a phase change material using an atomic layer deposition (ALD) method having a superior step coverage characteristic compared with a sputtering method.

Figure 4:
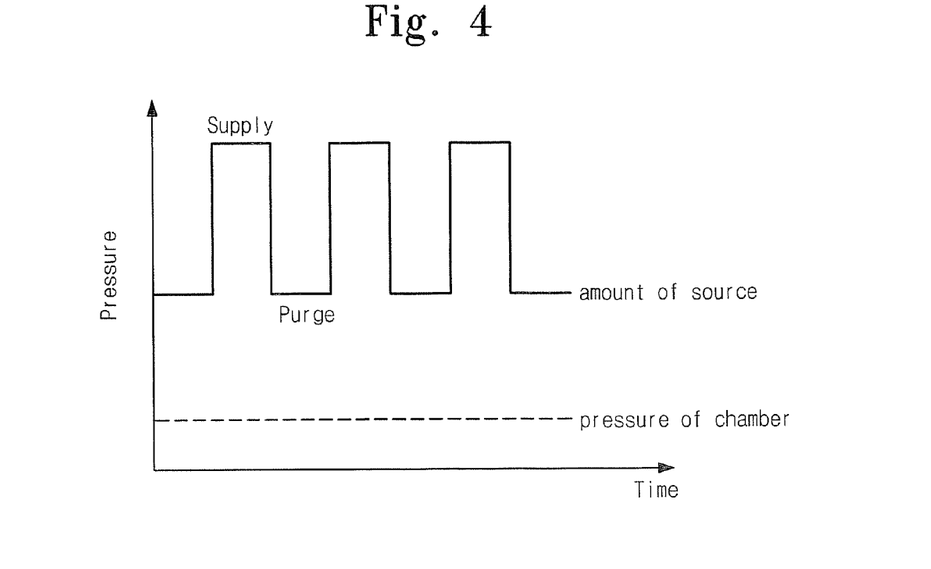
FIGS. 4 and 5 are graphs illustrating operations for forming a phase-change layer according to some embodiments of the present invention.
Figure 5:
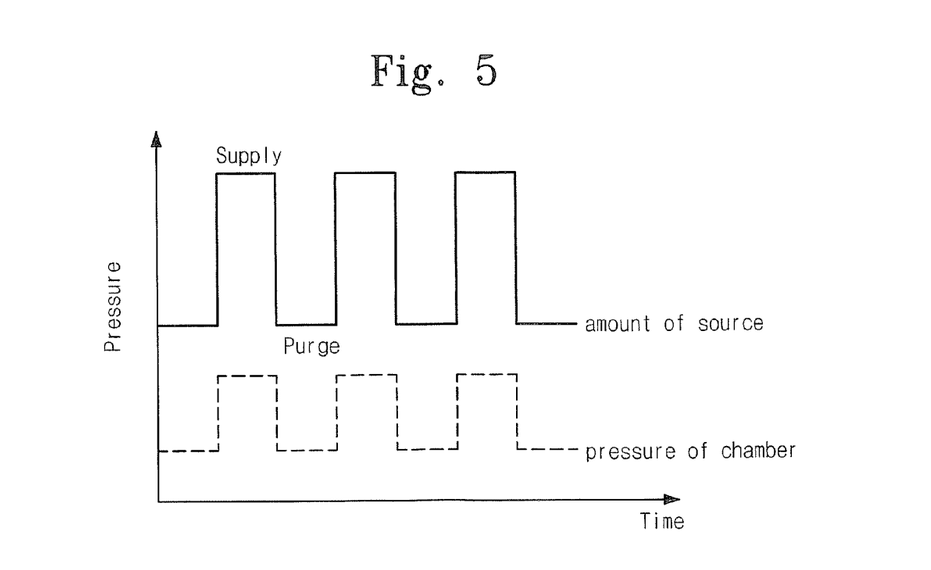

FIGS. 4 and 5 are graphs representing operations for forming a phase-change layer according to some embodiments of the present invention. In these figures, the horizontal axis represents a source supplying time and the vertical axis represents a pressure of a source and a chamber. Referring to FIGS. 4 and 5, a phase change layer may be formed using an atomic layer deposition (ALD) wherein a source material for depositing a phase change material is repeatedly fed into a process chamber and then purged. A liquefied material may be evaporated to supply the source material to the process chamber. The amount of a source material after a purge may be zero. A supply pressure of the source material may be set to be greater than a purge pressure of the source material. When the source material is supplied to a process chamber, the source material may be supplied with a reaction gas or either the source material or the reaction gas may be supplied to a process chamber in advance.

As depicted in FIG. 4, a chamber pressure may be maintained regardless of whether the source material is being supplied or purged. As depicted in FIG. 5, when the source material is supplied to a chamber, a chamber pressure may be set relatively high; when the source material is purged, the chamber pressure may be set relatively low. In other words, a pressure cycle may be used that, when a source material is fed into the chamber, the pressure of the chamber is increased to accelerate a reaction of the source and a reaction gas and, when the source material is purged, the chamber pressure is decreased to effectively remove gases, such as fumes of unreacted source material, from the chamber. A maximum value of the chamber pressure may be equal to or lower than a supply pressure of a source gas and a minimum value of the chamber pressure may be equal to or lower than a purge pressure of a source gas. If depositing a phase change material using an ALD method including a pressure change cycle, a wanted composition of a phase change layer can be set and a composition distribution of a phase change layer may be uniformly set.

Figure 6A:
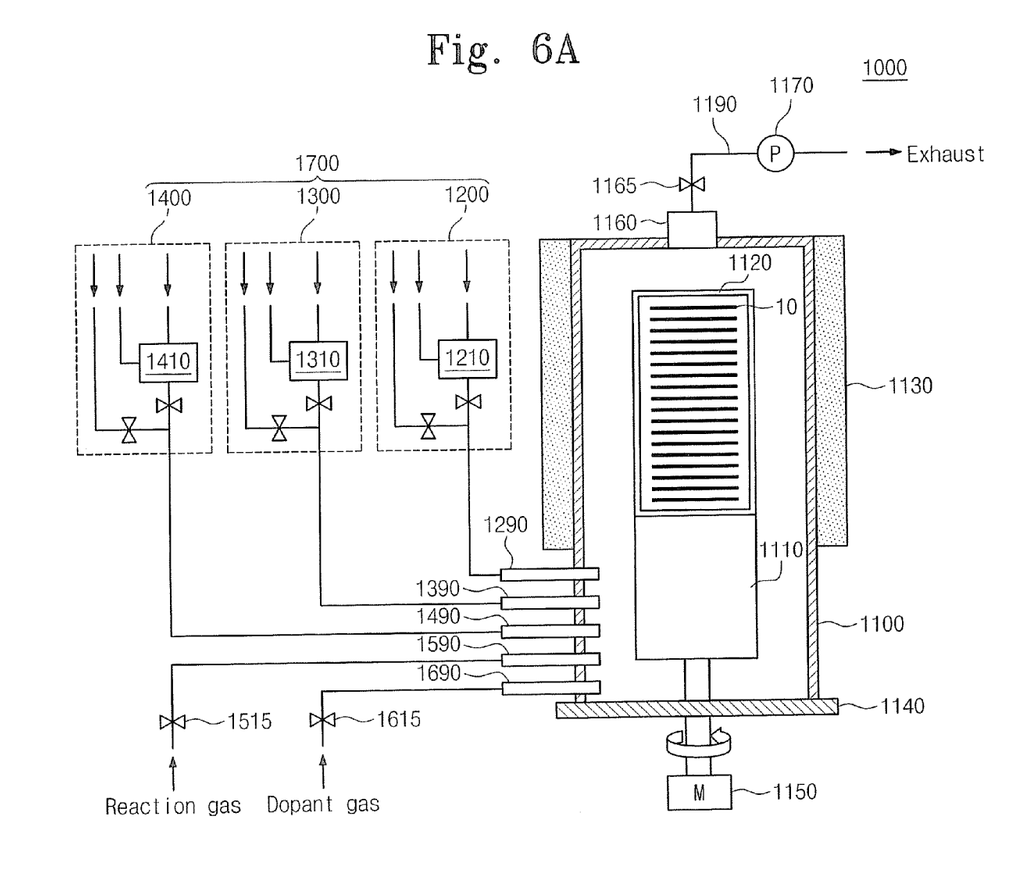
FIG. 6A is a schematic view of an apparatus for forming a phase-change layer according to some embodiments of the present invention.
Figure 6B:
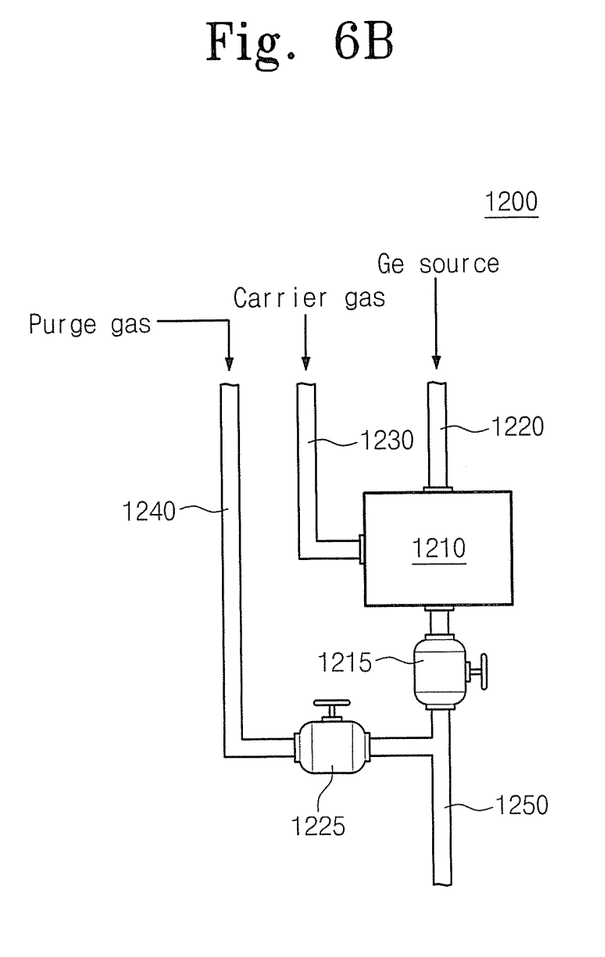
FIG. 6B is a schematic view depicting a portion of FIG. 6A.

FIG. 6A is a schematic view of apparatus which can form a phase-change layer according to some embodiments of the present invention, and FIG. 6B is a schematic view of a portion of FIG. 6A. An apparatus described later is a batch type which can handle a plurality of wafers but an embodiment described later can also be applied to an apparatus of a single type which can handle one wafer.

Referring to FIG. 6A, an apparatus 1000 according to some embodiments of the present invention may include a chamber 1100 in which a deposition process is substantially performed. The chamber 1100 may include a pedestal 1110 on which a boat 1120 holding a plurality of wafers 10 is placed. The pedestal 1110 and the boat 1120 may be formed as a single body. Alternatively, the boat 1120 can be removably attachable to the pedestal 1110. The pedestal 1110 can be rotated by driving a motor 1150. The chamber 1100 may be opened or closed by operation of a cap 1140, which may, for example, be a sliding cap. A heater 1130 that may control a temperature of the chamber 1100 may be installed on an outer wall of the chamber 1100.

In the chamber 1100, an exhaust tube 1190 discharging an unreacted source or other remaining gas may be connected to an exhaust port 1160. The exhaust port 1160 may be installed on a top portion of the chamber 1100. The exhaust tube 1190 may include a valve 1165 configured to control a flow gas which is discharged and a pump 1170 for a forced exhaust.

The apparatus 1000 may include a source supply portion 1700 supplying a source material required to form a phase change layer. The source supply portion 1700 may be constituted in a type of supplying a classified source of main ingredients constituting a phase change layer. For example, if a phase change layer is to have a binary composition, such as Ga—Sb, In—Sb, In—Se, Sb—Te, Ge—Te and Ge—Sb, the source supply portion 1700 may supply two kinds of source materials to the chamber 1100. For another example, if a phase change layer is to have a ternary composition, such as Ge—Sb—Te, Ge—Sb—In, Ge—Bi—Te, Ge—Te—As, Ge—Te—Sn, Ge—Se—Te, As—Sb—Te, In—Sb—Te, Ga—Se—Te, Sn—Sb—Te, Ga—Sb—Te, an element of 5A group-Sb—Te, an element of 6A group-Sb—Te, an element of 5A group-Sb—Se, and an element of 6A group-Sb—Se, the source supply portion 1700 may supply three kinds of source materials to the chamber 1100.

For yet another example, if a phase change layer is to have a quaternary composition, such as Ge—Te—Sn—Au, Ge—Te—Sn—Pd, Ge—Te—Sn—O, Ge—Sb—Te—S, (GeSn)—Sb—Te, Ge—Sb—(SeTe), In—Sb—Te—Ag, Ge—Sb—Te—O, Ge—Sb—Te—N, an element of 5A group-Sb—Te—Si, an element of 6A group-Sb—Te—Si, an element of 5A group-Sb—Se—Si, and an element of 6A group-Sb—Se—Si, the source supply portion 1700 may supply four kinds of source materials to the chamber 1100.

In the illustrated embodiments, a phase change layer may include Ge, particularly Ge—Sb—Te (hereinafter, it is referred to as GST). However, a phase change layer formed according to embodiments of the present invention is not limited to Ge—Sb—Te.

The source supply portion 1700 may include a first source supply portion 1200, a second source supply portion 1300 and a third source supply portion 1400. The first source supply portion 1200 may supply a precursor including germanium (Ge) (e.g., an organo-metallic compound containing Ge). The second source supply portion 1300 may supply a precursor including tellurium (Te) (e.g., an organo-metallic compound containing Te). The third source supply portion 1400 may supply a precursor including antimony (Sb) (e.g., an organo-metallic compound containing Sb). A Ge source material may be one of $Ge(CH_3)_4$, $Ge(C_2H_5)_4$, $Ge(n-C_4H_9)_4$, $Ge(i-C_4H_9)_4$, $Ge(C_6H_5)_4$, $Ge(CH_2=CH)_4$, $Ge(CH_2CH=CH_2)_4$, $Ge(CF_2=CF)_4$, $Ge(C_6H_5CH_2CH_2CH_2)_4$, $Ge(CH_3)_3(C_6H_5)$, $Ge(CH_3)_3(C_6H_5CH_2)$, $Ge(CH_3)_2(C_2H_5)_2$, $Ge(CH_3)_2(C_6H_5)_2$, $GeCH_3(C_2H_5)_3$, $Ge(CH_3)_3(CH=CH_2)$, $Ge(CH_3)_3(CH_2CH=CH_2)$, $Ge(C_2H_5)_3(CH_2CH=CH_2)$, $Ge(C_2H_5)_3(C_5H_5)$, $Ge(CH_3)_3H$, $Ge(C_2H_5)_3H$, $Ge(C_3H_7)_3H$, $Ge(i-C_3H_7)H_3$, $Ge(C_4H_9)_3H$, $Ge(t-C_4H_9)H_3$, $Ge(N(CH_3)_2)_4$, $Ge(N(CH_3)(C_2H_5))_4$, $Ge(N(C_2H_5)_2)_4$, $Ge(N(i-C_3H_7)_2)_4$, $Ge(N(Si(CH_3)_3)_2)_4$ and combinations thereof. A Te source material may be one of $Te(CH_3)_2$, $Te(CH(CH_3)_2)$, $Te(C_2H_5)_2$, $Te(n-C_3H_7)_2$, $Te(i-C_3H_7)_2$, $Te(C_4H_9)$, $Te(t-C_4H_9)_2$, $Te(i-C_4H_9)_2$, $Te(CH_2=CH)_2$, $Te(CH_2CH=CH_2)_2$, $Te(N(Si(CH_3)_3)_2)_2$ and combinations thereof. An Sb source material may be one of $Sb(CH_3)_3$, $Sb(C_2H_5)_2$, $Sb(C_3H_7)_3$, $Sb(i-C_3H_7)_3$, $Sb(n-C_3H_7)_3$, $Sb(i-C_4H_9)_3$, $Sb(t-C_4H_9)_3$, $Sb(N(CH_3)_2)_3$, $Sb(N(CH_3)(C_2H_5))_3$, $Sb(N(C_2H_5)_2)_3$, $Sb(N(i-C_3H_7)_2)_3$ $Sb(N(Si(CH_3)_3)_2)_3$ and combinations thereof.

Referring to FIGS. 6A and 6B, a Ge source material may be supplied to the first source supply portion 1200 in a liquefied state. The first source supply portion 1200 may include an evaporator 1210 which can evaporate the liquefied Ge source material. A source inflow line 1220 into which a liquefied Ge source material flows may be disposed in a front part of the evaporator 1210 and a source outflow line 1250 through which an evaporated Ge source discharges may be disposed in rear part of the evaporator 1210. The source outflow line 1250 may be connected to a first source supply tube 1290.

The first source supply portion 1200 may include a carrier gas inflow line 1230 into which a carrier gas flows. The carrier gas carries a Ge source material to the chamber 1100. The carrier gas inflow line 1230 may be connected to the evaporator 1210. Carrier gas may include an inert gas such as argon (Ar), helium (He), or nitrogen ($N_2$). A Ge gas in a liquefied state which flows into the first source supply portion 1200 is evaporated in the evaporator 1210. The evaporated Ge gas is loaded into a carrier gas and may be supplied to the chamber 1100 through the first source supply tube 1290. The amount of a Ge source material loaded into the carrier gas supplied to the chamber 1100 may be controlled by the degree of opening and closing of the valve 1215.

The first source supply portion 1200 may further include a purge gas inflow line 1240. Thus, the first source supply portion 1200 can supply a purge gas to the chamber 1100. The purge gas inflow line 1240 may be connected to the source outflow line 1250. Nitrogen ($N_2$) or an inert gas may be adopted as the purge gas. The purge gas flow into the chamber 1100 is controlled by the valve 1225.

The second source supply portion 1300 may be constituted so that a Te source material in a liquefied state is evaporated in an evaporator 1310, and the evaporated Te source material is loaded into a carrier gas and supplied to the chamber 1100 through a second source supply tube 1390. The construction of the second source supply portion 1300 may be substantially similar to that of the first source supply portion 1200. The third source supply portion 1400 may be constituted so that a Sb source material in a liquefied state is evaporated in an evaporator 1410, and the evaporated Sb source material is loaded into a carrier gas and supplied to the chamber 1100 through a third source supply tube 1490. The construction of the third source supply portion 1400 may be substantially similar to that of the first source supply portion 1200.

Referring to FIG. 6A again, the apparatus 1000 may include a reaction gas supply tube 1590 for supplying a reaction gas to the chamber 1100. For example, any one of $H_2$, $NH_3$, $N_2H_4$, $SiH_4$, $B_2H_6$, $O_2$, $O_3$, $H_2O$ and combinations thereof may be used as a reaction gas. The reaction gas may decompose a Ge source material to separate Ge from the other components of the Ge source material. A supply of the reaction gas to the chamber 1100 is controlled by a valve 1515.

The apparatus 1000 may include a dopant gas supply tube 1690 for supplying a dopant gas to the chamber 1100. The dopant gas may include a dopant such as Si or N which can make a crystalline size of a phase change layer small. Such techniques are described in U.S. Patent Application Publication No. 2006/0027451, which is incorporated by reference herein in its entirety. The dopant gas may be a gas including O, Bi, Sn and B in addition to Si and N. A supply of the dopant gas to the chamber 1100 is controlled by a valve 1615.

A pressure of the chamber 1100 can be controlled by a supply of a purge gas or a reaction gas to the chamber 1100 and an operation of the valve 1165. For example, if supplying a purge gas to the chamber 1100 while suppressing discharge of the purge gas by closing the valve 1165, the pressure of the chamber 1100 may be increased. If supplying a reaction gas to the chamber 1100 while suppressing discharge of the reaction gas by closing the valve 1165, a pressure of the chamber 1100 may be increased.

In some embodiments, a phase change layer (GST) may be formed by supplying a reaction gas to the chamber 1100 and performing a supply and a purge of a Ge source material, a supply and a purge of a Te source material, and a supply and a purge of an Sb source material. A source material may be loaded into a carrier gas and then supplied to the chamber 1100. A composition of a phase change layer can be controlled by controlling a temperature and/or a pressure of the source material and/or by controlling a supply time or a supply amount of a source material under fixed temperature and/or pressure. Such techniques are described in U.S. Patent Application Publication No. 2007/048977, incorporated by reference herein in its entirety.

In further embodiments, a phase change layer GST of GeTe/SbTe structure may be formed by supplying a reaction gas to the chamber 1100, simultaneously loading a Ge source material and a Te source material into a carrier gas and supplying the loaded carrier gas to the chamber 1100 to form a Ge—Te layer, supplying a purge gas to the chamber 1100 to purge unreacted gas, simultaneously loading a Sb source material and a Te source material into a carrier gas and supplying the loaded carrier gas to the chamber 1100 to form a SbTe layer, and supplying a purge gas is supplied to chamber 1100 to purge unreacted gas. The composition of the phase change layer can be controlled by controlling the supply amount and the supply time of the source material. Such operations are described in U.S. Patent Application Publication No. 2007/0160760, which is incorporated by reference in its entirety.

In additional embodiments, a GST phase change layer may be formed by supplying a Ge source material to the chamber 1100 to form a Ge layer, supplying a first purge gas to the chamber 1100, supplying a Te source material to the Ge layer to form a GeTe layer, supplying a second purge gas to the chamber 1100, supplying a Sb source material to the GeTe layer to form a Sb layer on the GeTe layer, supplying a third purge gas to the chamber 1100, supplying a Te source material to the Sb layer to form a SbTe layer on the GeTe layer and supplying a fourth purge gas to the chamber 1100. A composition of the phase change layer can be controlled by a supply time of the source material. Such operations are described in U.S. Patent Application Publication No. 2007/0054475, which is incorporated herein by reference in its entirety.

The deposition process may be performed by maintaining a pressure of a chamber at a specific value as described referring to FIG. 4 or by adopting a pressure change cycle as described referring to FIG. 5. The deposition process adopts a pressure change cycle and sets a pressure of a chamber when supplying a specific source higher than a pressure of a chamber when supplying other sources. A chamber temperature may be not limited to a specific range or may be set within a specific range.

Figure 7:
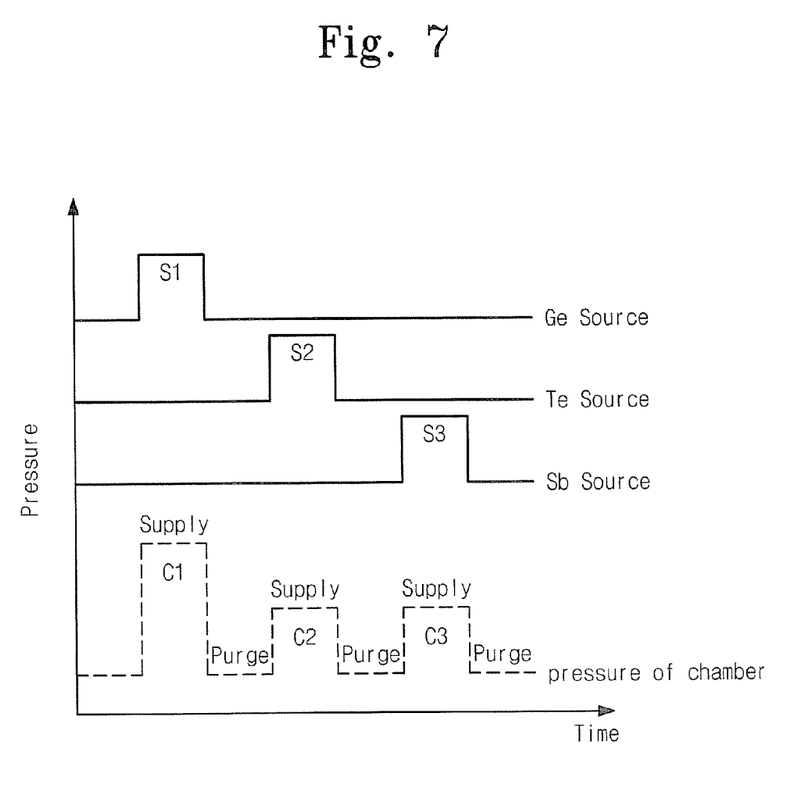
FIG. 7 is a graph illustrating high pressure deposition conditions for fabricating a phase-change layer according to some embodiments of the present invention.

FIG. 7 is a graph illustrating operations for forming a phase-change layer according to further embodiments of the present invention. Referring to FIG. 7, when supplying first, second and third source materials to a chamber, a pressure of the chamber may be set high; when purging the first, second and third source materials, a pressure of the chamber may be set low. In some embodiments, a pressure of a chamber when supplying a particular source material may be different from a pressure when supplying other source materials so as to provide a desired composition.

In some embodiments, in order to increase Ge content, when supplying Ge source material to a chamber, a pressure of the chamber may be set to C1. When supplying a Te source material to the chamber, a pressure of the chamber may be set to C2<C1. When supplying a Sb source material to the chamber, a pressure of the chamber may be set to C3<C1. Any one of C2 and C3 may be equal or similar to or greater than the other. Ge supply pressure (S1) may be higher than Te supply pressure (S2) and Sb supply pressure (S3). Selectively, a supply time or a supply amount of a specific source (e.g., Ge) may be changed to arbitrarily change a content of a specific ingredient (e.g., Ge). However, a change of a composition ratio of a specific ingredient may be more dependent on chamber pressure change than a supply time or a supply amount of a source material.

In further embodiments, when supplying a source, a pressure of a chamber may be set to be equal (C1=C2=C3). In this case, a decomposition of each source material may be accelerated compared with a conventional art which does not change a pressure of a chamber.

A process of depositing a phase change layer using an ALD method adopting the pressure change cycle may be performed as follows.

Referring to FIGS. 6A and 7, the valve 1515 is opened to supply a reaction gas to the chamber 1100 as a step of supplying a reaction gas. A pressure of the chamber 1100 may be set to C1 by closing the exhaust valve 1165 during a supply of a reaction gas. In some embodiments, a temperature of the chamber 1100 may be not limited to a specific range. In another embodiment, a temperature of the chamber 1100 may be set within a specific range by a heater 1130. For example, a temperature of the chamber 100 may be set in the range of a room temperature to about 250 Celsius through a specific step (e.g., a step of supplying a source material) or all the steps.

Ge source material is supplied to the chamber 1100 as a first source material supply step. A liquefied Ge source material is evaporated in the evaporator 1210. An evaporated Ge source material is loaded into a carrier gas and the evaporated Ge source material loaded into the carrier gas may be supplied to the chamber 1100 at a pressure S1. The S1 may be greater than the pressure C1. A supply time of Ge source material may be arbitrarily set and the amount of Ge source material may be determined depending on the pressure S1 and a supply time. Ge source material supplied to the chamber 1100 reacts with a reaction gas. For example, when $NH_3$ is adopted as a reaction gas, NH₃ is decomposed into NH₂⁻ and H⁺ to react with Ge source material and a remaining N may be doped to a Ge layer.

A Ge source material supply is interrupted and a purge gas is supplied to the chamber 1100 as a first source material purge step. A pressure of the chamber 1100 is set to be lower than the pressure C1 by opening an exhaust valve 1165 to purge an unreacted gas from the chamber 1100.

A reaction gas is supplied to the chamber 1100 as a second reaction gas supply step. A pressure of the chamber 1100 may be set to C2 (<C1) by closing the exhaust valve 1165. The reaction gas may be the same as or different from the NH₃ reaction gas used when Ge source material is supplied. In the present embodiments, NH₃ is adopted as a reaction gas.

Te source material is supplied to the chamber 1100 as a second source material supply step. A liquefied Te source material is evaporated in the evaporator 1310. An evaporated Te source material is loaded into a carrier gas and the loaded carrier gas supplied to the chamber 1100 at a pressure S2<S1. The pressure S2 may be greater than the pressure C2. GeTe may be deposited by a reaction of Te source material and the reaction gas.

Te source material supply is interrupted and a purge gas is supplied to the chamber 1100 as a second source material purge step. A pressure of the chamber 1100 is set to be lower than the pressure C2 by opening an exhaust valve 1165 to purge unreacted gas from the chamber 1100.

A reaction gas NH₃ is supplied to the chamber 1100 as a third reaction gas supply step. A pressure of the chamber 1100 may be set to C3<C1 by closing the exhaust valve 1165. C3 may be equal to or different from C2.

Sb source material is supplied to the chamber 1100 as a third source material supply step. A liquefied Sb source material is evaporated in the evaporator 1410. The evaporated Sb source material is loaded into a carrier gas and the loaded carrier gas supplied to the chamber 1100 at a pressure of S3<S1. S3 may be equal to or different from S2. Sb may be deposited on the GeTe by a reaction of Sb source material and a reaction gas.

Sb source material supply is interrupted and a purge gas is supplied to the chamber 1100 as a third source material purge step. A pressure of the chamber 1100 is set to be lower than C3 by opening an exhaust valve 1165 to purge unreacted gas from the chamber 1100.

A reaction gas is supplied to the chamber 1100 as a fourth reaction gas supply step. A pressure of the chamber 1100 may be set to C2 by closing the exhaust valve 1165. As a fourth source material supply step, Te source material may be supplied to the chamber 1100 at a pressure S2. The Te source material reacts with the reaction gas to deposit SbTe. Te source material supply is interrupted and a purge gas is supplied to the chamber 1100 as a fourth source material purge step. A pressure of the chamber 1100 is set lower than C2 by opening the exhaust valve 1165 to purge unreacted gas from the chamber 1100.

A phase change layer GST may be formed by the supply sequence of G-T-S-T (G=Ge, T=Te, S=Sb) described above. That is, GeTe is deposited by G-T supply sequence and SbTe (e.g., Sb₂Te₃) is deposited by S-T supply sequence. When supplying each source material, a dopant gas may be further supplied to the chamber 1100 by opening the valve 1615 if necessary.

A supply sequence is not limited to G-T-S-T and various modified examples (e.g., G-S-T, GT-T-S-T, GT-ST, GT-T-S-T and so on) may be applied.

When depositing GST at a high temperature of more than 275 Celsius, it may be difficult to fill a hole (referring to 125 of FIG. 1) having a minute shape or a complicated shape due to a generation of grain. However, according to some embodiments, a dopant gas (e.g., a dopant gas containing Si or N) which can make a crystalline size of GST layer relatively small is supplied to the chamber 1100 to deposit GST having a small grain size at a high temperature of more than 275 Celsius.

It is known that a grain size of a GST phase change layer may be great at a deposition temperature of more than 275 Celsius, and Te in a phase change layer volatilizes at a high temperature of about 350 Celsius. Thus, it has been conventionally practiced limitation that GST should be deposited at a low temperature of less than 275 Celsius (e.g., 250 Celsius). However, at a low deposition temperature, Ge content may not reach a desired level due to uncompleted decomposition of the source material, and unwanted gas, such as fumes, may be generated. Since Ge can be contained to be less than 3 atm % under the condition of a temperature of less than 250 Celsius and a pressure of 1 Torr, GST of a variety of compositions may be not formed.

According to some embodiments of the present embodiment, GST containing Ge of more than 20 atm % may be deposited at a low temperature of less than 250 Celsius as will be described referring to FIG. 8C. According to some embodiments, GST can be deposited at a temperature of more than 250 Celsius (e.g., a temperature of 350 Celsius to 400 Celsius).

Figure 8A:
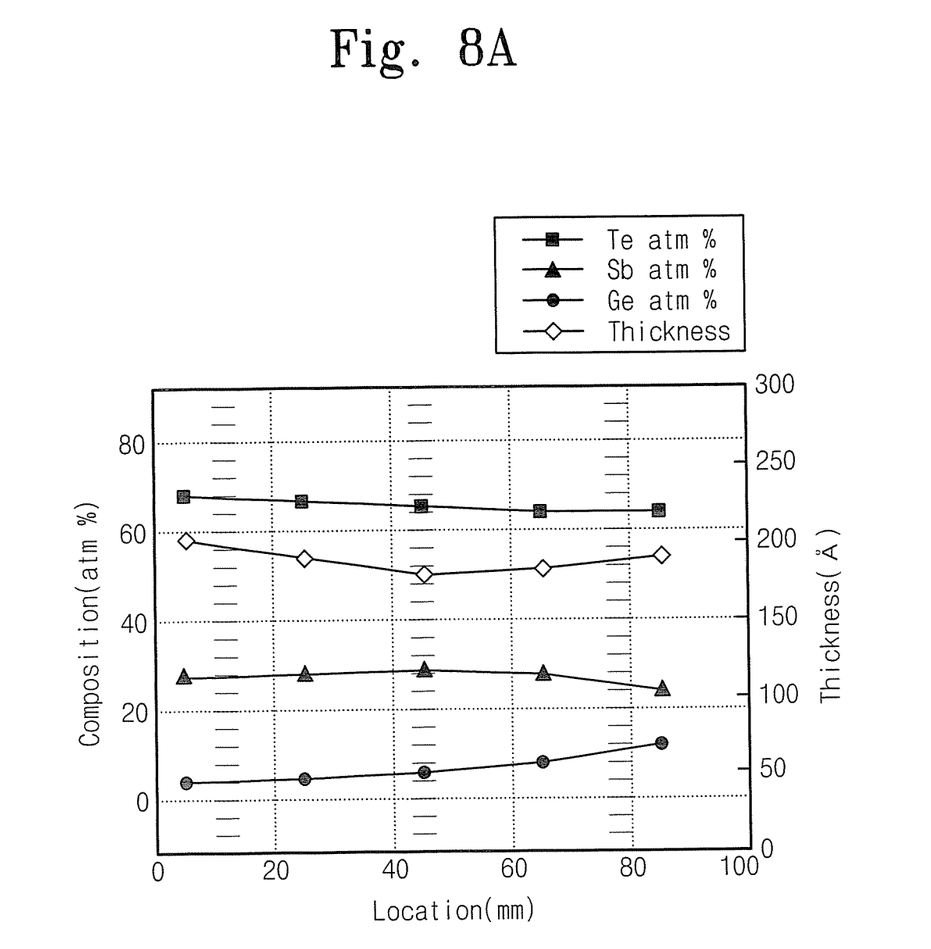
FIGS. 8A through 8C are graphs representing a result of a GST deposition according to a change of a chamber pressure when supplying a germanium (Ge) source material gas.
Figure 8B:
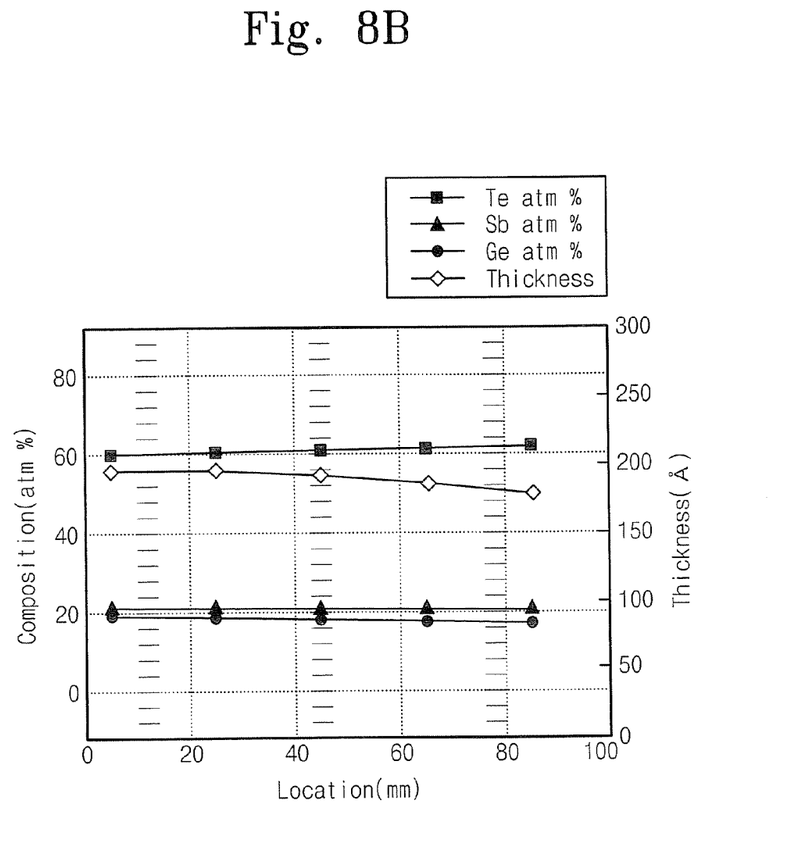
Figure 8C:
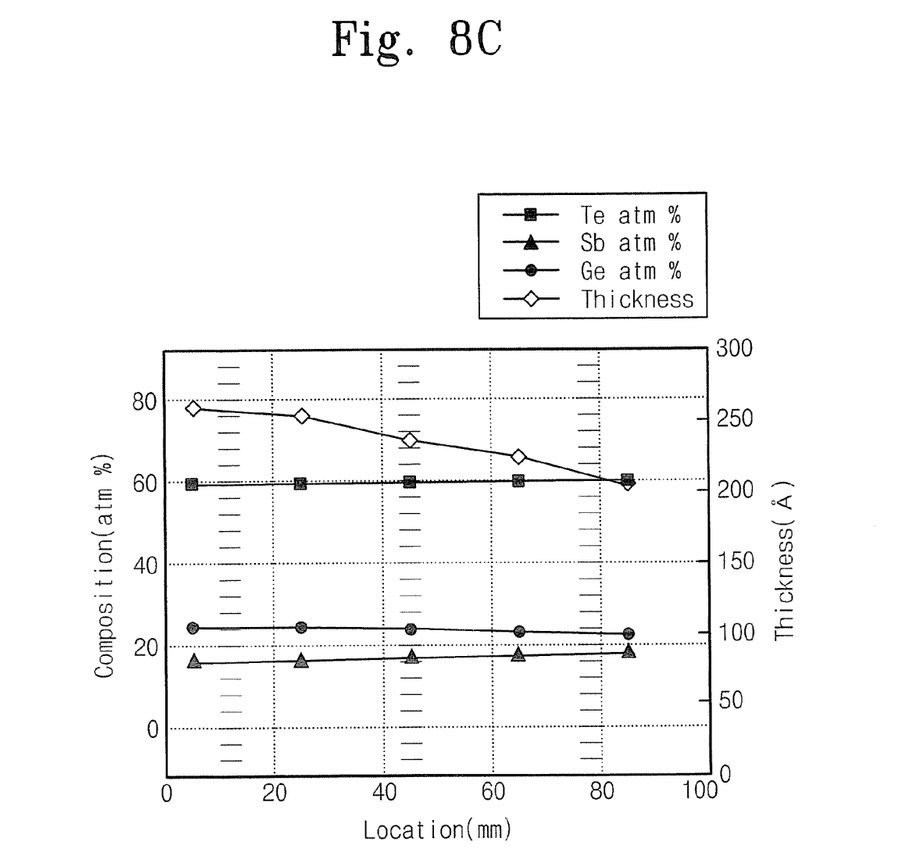

FIG. 8A through 8C are graphs representing a result of GST deposition according to a change of a chamber pressure when supplying Te and Sb source material gases under the condition of fixing a pressure of the chamber at 3 Torr in the supply sequence G-T-S-T of FIG. 7. In the graph, a composition of each ingredient is atm % unit and a thickness of GST layer is in angtroms (Å). A location is given in millimeters (mm) and represents a distance from a center (0 mm) of a wafer to an edge (100 mm) of a wafer. A temperature of the chamber is set to about 250 Celsius. However, the temperature of a chamber is not limited to this but may include temperatures of all the ranges. For example, in some embodiments, a temperature of a chamber more than 250 Celsius, or a temperature greater than room temperature and less than 400 Celsius can be used.

Referring to FIG. 8A, if a pressure of the chamber is set to 0.7 Torr when supplying Ge source material, a composition ratio of Ge:Te:Sb is about 8.0:0.27:4.64 and GST layer may be deposited to a thickness of about 190 Å. Ge content is relatively low compared with Te and Sb and a composition of Ge is relatively nonuniform depending on a location.

Referring to FIG. 8B, if the pressure of the chamber is changed to 3 Torr when supplying the Ge source material, Ge content is increased. As a result, a composition ratio of Ge:Te:Sb becomes about 18.8:20.3:60.9. A GST layer may be deposited to a thickness of about 193 Å. A distribution of Ge composition in the GST layer is generally superior compared with FIG. 8A.

Referring to FIG. 8C, increasing the pressure of the chamber to 7 Torr when supplying Ge source material causes Ge content to be increased to more than 20 atm %. As a result, a composition ratio of Ge:Te:Sb becomes about 23.3:17.6:59.1 and Ge content is relatively uniform across the GST layer. It is believed that this is because the reaction gas effectively decomposes the Ge source material to accelerate a reaction with the substrate.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein

What is claimed is:

1. A method of forming a phase change layer comprising:
    sequentially supplying different metalloid source materials to a chamber to form the phase change layer; and
    purging each metalloid source material from the chamber after provision thereof to the chamber,
    wherein a pressure of the chamber is changed according to the supply of the metalloid source material and the purge of the metalloid source material,
    wherein changing the pressure of the chamber comprises:
        setting the chamber at a high pressure when supplying each of the metalloid source materials; and
        setting the chamber at a low pressure when purging each of the metalloid source materials,
    and wherein setting the chamber at a high pressure comprises setting the pressure of the chamber higher when supplying one of the metalloid source materials than when supplying the rest of the metalloid source materials.

2. The method of claim 1, wherein sequentially supplying different metalloid source materials to the chamber comprises loading each source material on a carrier gas including at least one of an inert gas, nitrogen and combinations thereof to carry the source material to the chamber.

3. The method of claim 1, further comprising supplying a reaction gas to the chamber, the reaction gas including any one of $H_2$, $NH_3$, $N_2H_4$, $SiH_4$, $B_2H_6$, $O_2$, $O_3$, $H_2O$ and combinations thereof which react to the source materials to decompose the source materials.

4. The method of claim 1, further comprising supplying a dopant gas including any one of Si, N, O, Bi, Sn, B and combinations thereof to the chamber.

5. A method of forming a phase change layer comprising:
    supplying a source material to a chamber; and
    purging the source material from the chamber,
    wherein a pressure of the chamber is changed according to the supply of the source material and the purge of the source material, and wherein supplying a source material to the chamber comprises supplying a plurality of precursors to the chamber to form a phase change layer by depositing any one of Ga—Sb, In—Sb, In—Se, Sb—Te, Ge—Te, Ge—Sb, Ge—Sb—Te, Ge—Sb—In, Ge—Bi—Te, Ge—Te—As, Ge—Te—Sn, Ge—Se—Te, As—Sb—Te, In—Sb—Te, Ga—Se—Te, Sn—Sb—Te, Ga—Sb—Te, an element of 5A group-Sb—Te, an element of 6A group-Sb—Te, an element of 5A group-Sb—Se, an element of 6A group-Sb—Se, Ge—Te—Sn—Au, Ge—Te—Sn—Pd, Ge—Te—Sn—O, Ge—Sb—Te—S, (GeSn)—Sb—Te, Ge—Sb—(SeTe), In—Sb—Te—Ag, Ge—Sb—Te—O, Ge—Sb—Te—N, an element of 5A group-Sb—Te—Si, an element of 6A group-Sb—Te—Si, an element of 5A group-Sb—Se—Si, and an element of 6A group-Sb—Se—Si and wherein a pressure of the chamber is set higher when supplying one of the precursors than when supplying the rest of the precursors.

6. A method of forming a phase change layer comprising:
    supplying a reaction gas to a chamber;
    setting the chamber at a high pressure to supply Ge, Te and Sb source materials, wherein a pressure of the chamber is set higher when one of the source materials is supplied to the chamber to be hi her than a pressure of the chamber when the others of the source materials are supplied to the chamber;
    performing a reaction of the source materials to the reaction gas to deposit Ge—Sb—Te; and
    setting the chamber at a low pressure to purge the source materials.

7. The method of claim 6, wherein depositing the Ge—Sb—Te comprises:
    supplying the Ge source material to the chamber to deposit GeTe; and
    supplying the Sb source material and Te source material to the chamber to deposit $Sb_2Te_3$, thereby forming the Ge—Sb—Te having a GeTe—$Sb_2Te_3$ structure.

8. The method of claim 6, further comprising supplying a dopant gas including any one of Si, N, O, Bi, Sn, B and combinations thereof to the chamber.

9. The method of claim 6, further comprising setting the chamber in the range of a room temperature to 400 Celsius.

* * * * *